United States Patent [19]

Mistretta et al.

[11] Patent Number: 5,408,180
[45] Date of Patent: Apr. 18, 1995

[54] MEASUREMENT OF FLOW USING A COMPLEX DIFFERENCE METHOD OF MAGNETIC RESONANCE IMAGING

[75] Inventors: Charles A. Mistretta; Jason A. Polzin; Marc T. Alley, all of Madison, Wis.

[73] Assignee: Wisconsin Alumni Research Foundation, Madison, Wis.

[21] Appl. No.: 107,110

[22] Filed: Aug. 13, 1993

[51] Int. Cl.⁶ ............................................. G01V 3/00
[52] U.S. Cl. ................................... 324/306; 324/309
[58] Field of Search ............... 324/306, 307, 309, 311, 324/312, 314; 128/653.3, 653.4, 653.5

[56] References Cited

U.S. PATENT DOCUMENTS

| 4,683,431 | 7/1987 | Pattany et al. | 324/306 |
| 4,689,560 | 8/1987 | Nayler et al. | 324/306 |
| 5,226,418 | 7/1993 | Bernstein et al. | 128/653.3 |
| 5,363,042 | 11/1994 | Dumoulin | 324/306 |

OTHER PUBLICATIONS

David M. Weber, et al.; Quantitative Velocity Images from Thick Slab 2D Phase Contrast; MRM 29:216 (1993); 216–225 (mo. of pub. unknown).

Chao Tang, et al.; Accuracy of Phase-Contrast Flow Measurements in the Presence of Partial-Volume Effects; JMRI vol. 3, No. 2, 1993; 377–384 (mo. of pub. unknown).

Ronald L. Wolf, et al.; Analysis of Systematic and Random Error in MR Volumetric Flow Measurements; MRM 39:82–91 (1993); 82–91 (mo. of pub. unknown).

Chao Tang, et al.; Correction of Partial Volume Effect in phase contrast flow measurements; Sep. 17, 1993; 22 pages (mo. of pub. unknown).

Primary Examiner—Louis Arana
Attorney, Agent, or Firm—Quarles & Brady

[57] ABSTRACT

NMR image data is acquired with velocity encoding gradients applied and both a phase difference image array and a complex difference image array are produced. A flow image is produced from the complex difference image array after it is corrected for spin saturation effects and calibrated using information derived from the phase difference image array. Total blood flow through vessels can be measured from the flow image.

5 Claims, 4 Drawing Sheets

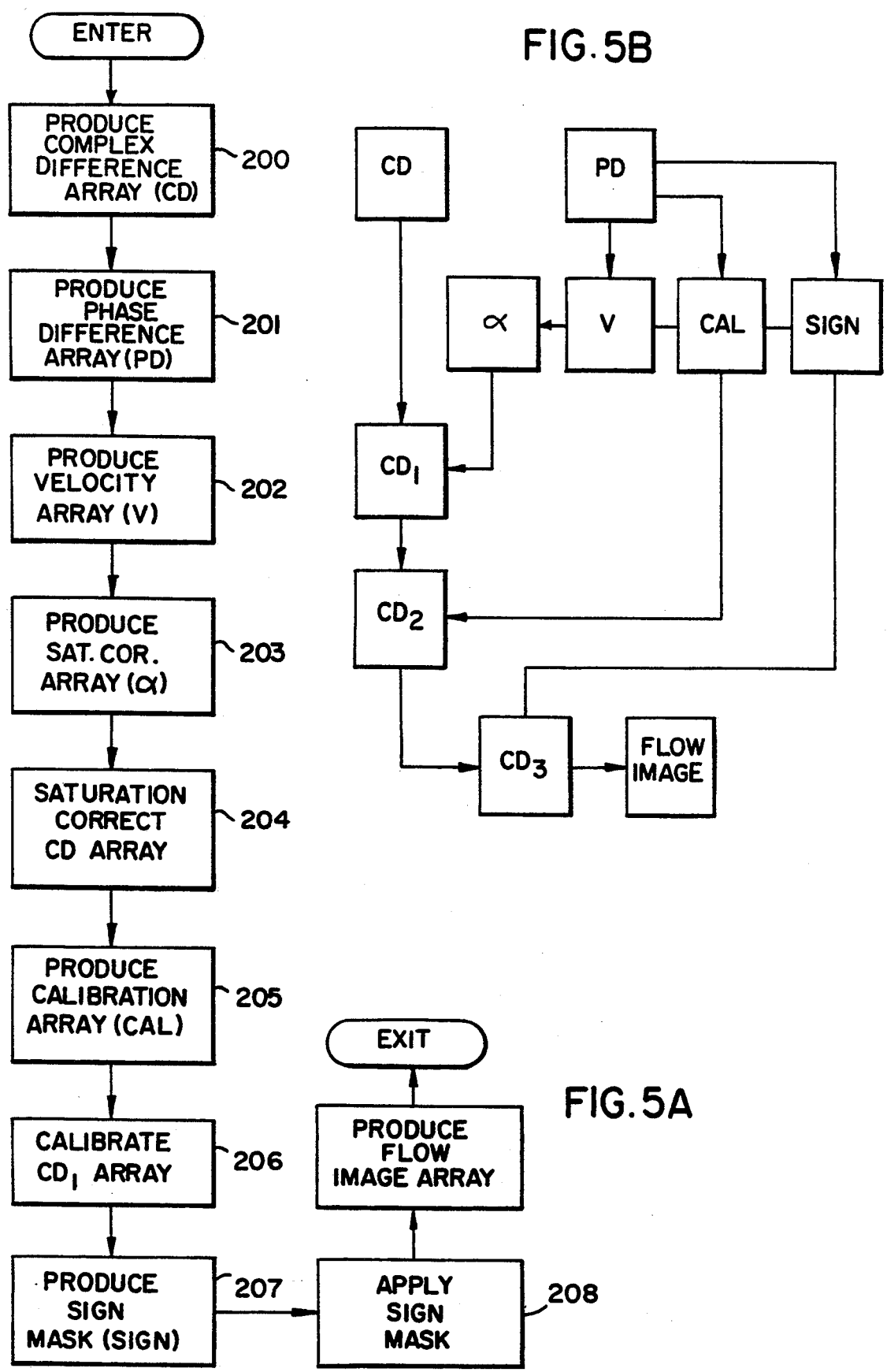

MEASUREMENT OF FLOW USING A COMPLEX DIFFERENCE METHOD OF MAGNETIC RESONANCE IMAGING

BACKGROUND OF THE INVENTION

The field of the invention is nuclear magnetic resonance imaging methods and systems. More particularly, the invention relates to the measurement of blood flow using magnetic resonance imaging.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

There are a number of well known NMR techniques for measuring the motion, or flow of spins within the region of interest. These include the "time-of-flight" method in which a bolus of spins is excited as it flows past a specific upstream location and the state of the resulting transverse magnetization is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793 and 4,777,957.

A second flow measurement technique is the inflow/outflow method in which the spins in a single, localized volume or slice are excited and the change in the resulting transverse magnetization is examined a short time later to measure the effects of excited spins that have flowed out of the volume or slice, and the effects of differently excited spins that have flowed into the volume or slice. Examples of this method are described in U.S. Pat. Nos. 4,574,239; 4,532,474 and 4,516,582.

A third technique for measuring motion flow relies upon the fact that an NMR signal produced by spins flowing through a magnetic field gradient experiences a phase shift which is proportional to velocity. This is referred to in the art as the "phase modulation" technique. For flow that has a roughly constant velocity during the measurement cycle the change in phase of the NMR signal is given as follows:

$$\Delta\phi = \gamma M_1 v$$

where $M_1$ is the first moment of the magnetic field gradient, $\gamma$ is the gyromagnetic ratio and $v$ is the velocity of the spins. To eliminate errors in this measurement due to phase shifts caused by other sources, it is common practice to perform the measurement at least twice with different magnetic field gradient moments as described in U.S. Pat. No. 4,609,872. The difference in phase at any location between the two measurements is then as follows:

$$\Delta\phi = \gamma \Delta M_1 v$$

By performing two complete scans with different magnetic field gradient first moments and subtracting the measured phases in the reconstructed image at each location in the acquired data arrays, a phase map is produced.

The phase ($\phi$) of each pixel in the phase map is determined by taking the ratio of the imaginary and real components of the NMR signal and then taking the arctangent. This phase map can be converted into a velocity image using the known flow encoding gradient first moment $M_1$ and the constant $\gamma$. The product of the velocity values in this image times the voxel size integrated over a blood vessel cross section provides an estimate of total blood flow through the vessel. The availability of such quantitative blood flow measurements in conjunction with the anatomical information provided by the magnetic resonance angiogram provides a more accurate method of assessing lesion significance. When applied to human coronary arteries, for example, the ratio of blood flow rates before and after the introduction of a pharmaceutical vasodilator provides an indication of coronary flow reserve which is a more accurate measure of lesion significance than morphological angiographic appearance.

Unfortunately, the phase difference method of measuring blood flow is not accurate when applied to small vessels, such as coronary vessels. The method assumes that the voxel is completely filled with spins moving at the measured velocity. When flowing spins occupy, for example, only one half the pixel volume and there are no static spins in the volume, the same phase value $\phi$ will be measured for both voxels, but the flow in one voxel is only one half that of the flow in the other voxel. This difference is shown in FIGS. 4A and 4B, where the vector 10 is the measured NMR signal for the full voxel and the vector 11 is the NMR signal for a half-full voxel. As shown in FIG. 4C, on the other hand, when a voxel is occupied by moving spins and static spins, the measured phase angle $\phi'$ will be altered by the signal component due to static spins indicated by vector 12. Rather than a true flow measurement as indicated by vector 13, therefore, an erroneous apparent flow indicated by vector 14 will be measured.

As shown in FIG. 4D, for example, where the blood vessels has a diameter only 2 to 3 times the voxel size, the phase difference flow measurement may be accurate for only one voxel 15 out of the nine voxels that indicate flowing spins in the vessel 16. As a result, when the indicated flow of all nine voxels are summed to measure the total flow in vessel 16, the error can be considerable. The error caused by the presence of static spins in the same voxel with moving spins can be corrected to a certain extend by using the phase difference method described by David M. Weber et al in *Magnetic Resonance In Medicine*, MRM 29:216–225 (1993). However, this technique does not solve the flow overestimation problem caused by the partial occupation of the voxel by non-resonant nuclear species in tissues surrounding the blood vessel.

SUMMARY OF THE INVENTION

The present invention is an improved method for measuring flow in which an MRI scan is conducted with flow encoding magnetic field gradients applied and NMR data is acquired from which a phase difference array is produced as well as a complex difference array. A flow image is produced from the complex difference array after the values therein have been corrected for saturation effects using information derived from the phase difference array and the values therein have been calibrated using the phase difference array information.

A general object of the invention is to improve the accuracy of NMR flow measurements. The complex difference array data contains information regarding the density of flowing spins ($\rho$) and their velocity (v). However, this information is not accurate due to a number of phenomena. The present invention employs information in the phase difference array to measure these errors and enable the complex difference array to be corrected such that it more accurately measures flow in each voxel of the image.

A more specific object of the invention is to correct complex difference data used to produce a flow image for errors caused by saturation of the flowing spins as they pass through the excited slice. The phase difference array contains accurate spin velocity information, and this information is employed to determine how long spins are in the excited slice. Using this and information regarding the particular NMR pulse sequence used to acquire the data, corrections ($\alpha$) can be made to the complex difference array to offset the effects of spin saturation.

Yet another object of the invention is to calibrate the complex difference flow measurements. The velocity information embodied in the phase difference array is very accurate at the center of a blood vessel where the voxels do not contain stationary material. This velocity information is compared with the velocity information in the same central voxels of the complex difference array, and the ratio is used to calibrate the entire complex difference array. In other words, the values in the complex difference array are scaled by a factor (A) such that selected central voxels therein indicate the same spin velocity as the corresponding central voxels in the phase difference array.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 5A and 5B are diagrams of the process used to produce a flow image according to a preferred embodiment of the invention from the NMR data acquired with the pulse sequences of FIG. 3.

DESCRIPTION OF THE PREFERRED EMBODIMENT

Figure 1:
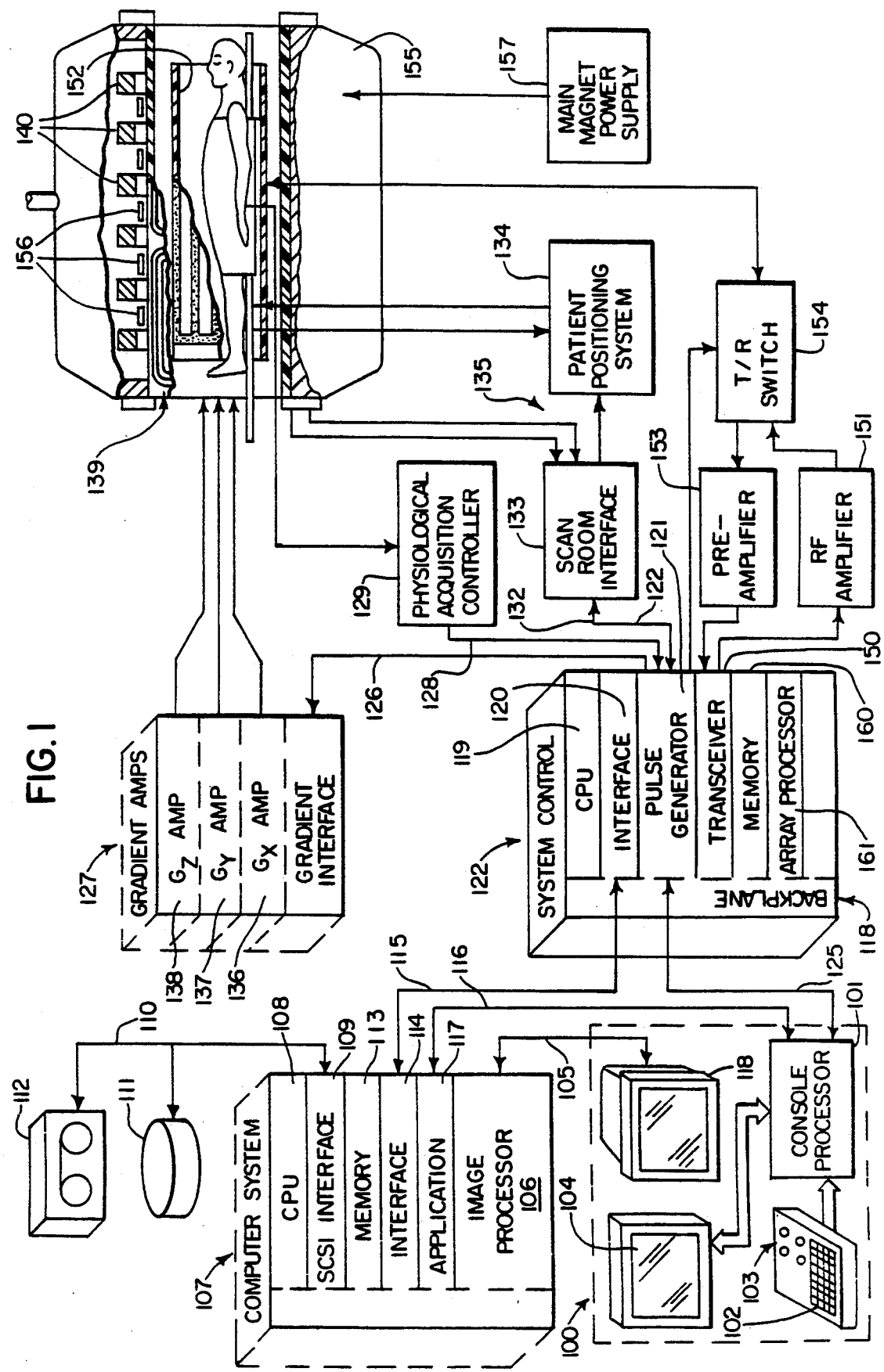
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 includes a number of modules which communicate with each other through a backplane. In addition to the application interface 117 and the image processor 106, these include a CPU module 108 that controls the backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_0 + G_x x + G_y y + G_z z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118.

Figure 2:
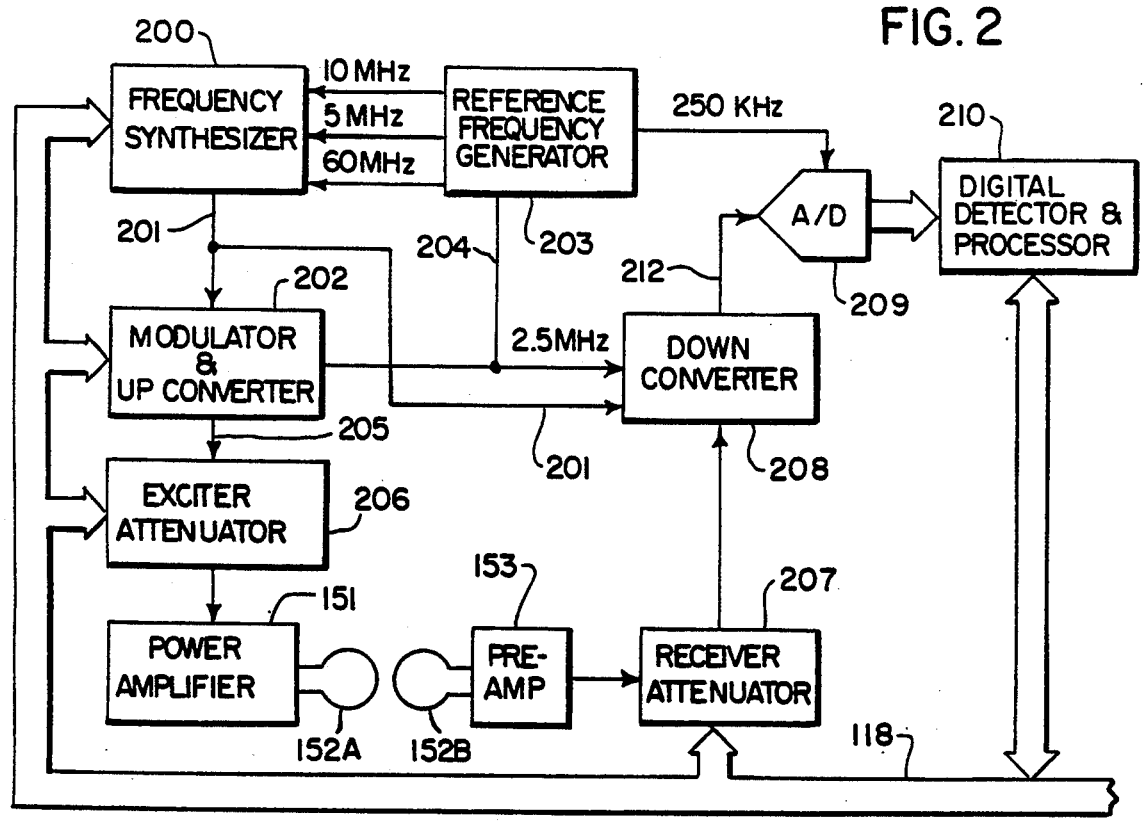
FIG. 2 is an electrical block diagram of the transceiver which forms part of the NMR system of FIG. 1.
Figure 4A:
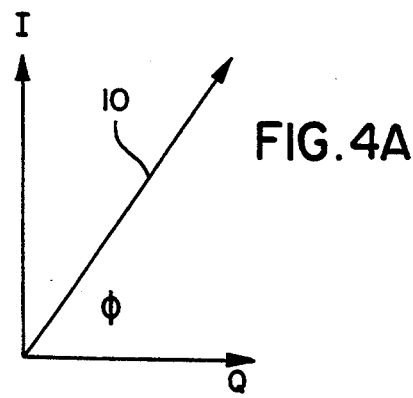
FIGS. 4A–4D are diagrams which illustrate the source of flow measurement errors in prior phase contrast methods.
Figure 4B:
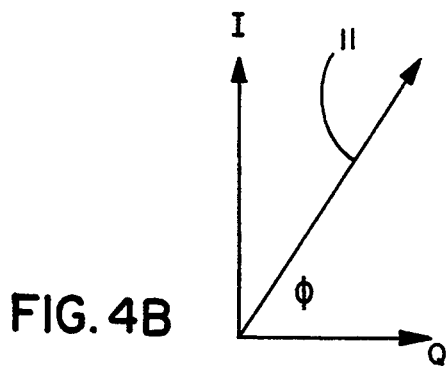
Figure 4C:
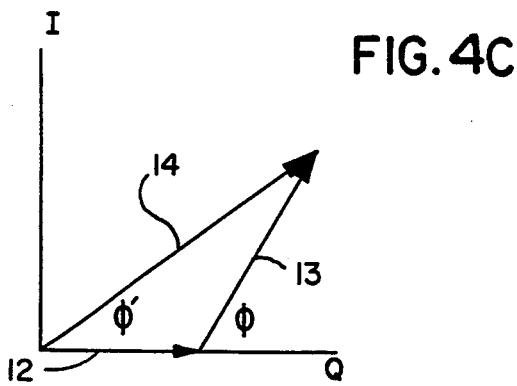
Figure 4D:
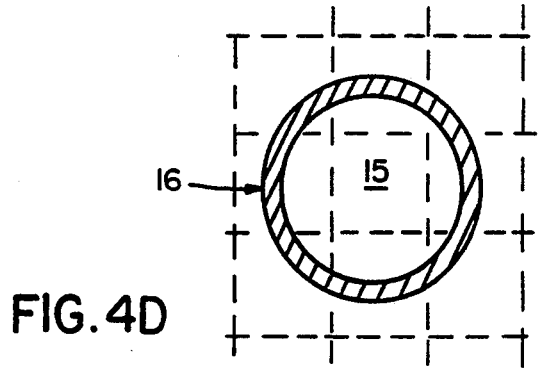

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3A:
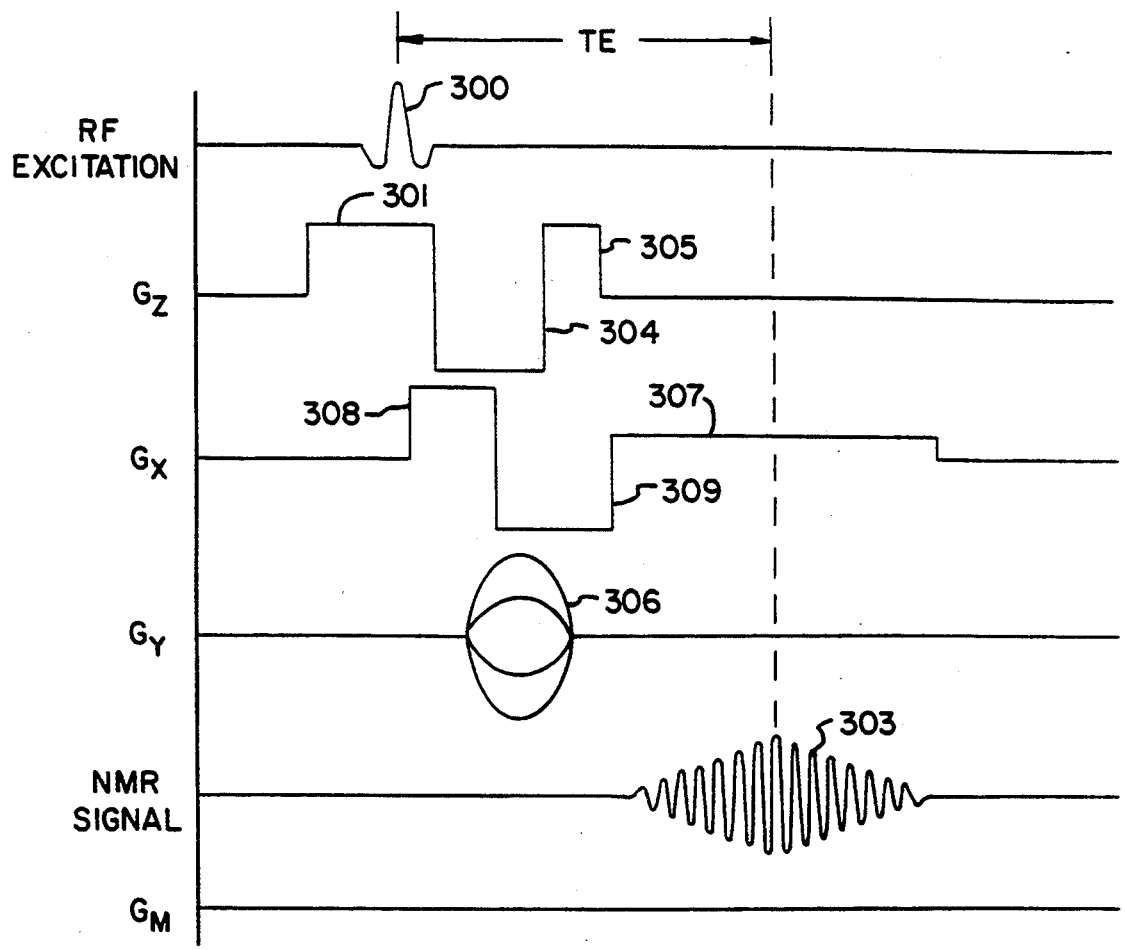
FIGS. 3A–3C are graphic illustrations of the pulse sequences employed by the NMR system of FIG. 1 to practice the present invention.

The NMR system of FIG. 1 performs a series of pulse sequences to collect sufficient NMR data to reconstruct the desired image. Referring particularly to FIG. 3A, the first pulse sequence is a conventional first order moment nulled gradient echo sequence in which a selective RF excitation pulse 300 is applied to the subject in the presence of a $G_z$ slice select gradient pulse 301. The excitation pulse 300 has a flip angle $\alpha$ with a typical value of $\alpha$ being 30°. To compensate the FID for the phase shifts caused by the slice select gradient pulse 301 and to desensitize the FID to velocity along the z axis, a negative $G_z$ gradient pulse 304 followed by a positive $G_z$ gradient pulse 305 are produced by the $G_z$ gradient coils. For example, one solution is to use a pulse 304 of the same width, but opposite sign, as the pulse 301, and the pulse 305 is one half the width and the same height as the pulse 301. While the pulses 304 and 305 compensate for velocity along the z axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to locate the position of the spins producing the NMR signal along the y axis. Position along the x axis is located by a $G_x$ gradient pulse 307 which is produced as the NMR gradient echo signal 303 is acquired and which frequency encodes the NMR signal 303. Unlike the $G_y$ phase encoding gradient pulse 306, the $G_x$ readout gradient pulse 307 remains at a constant value during the entire scan. To produce the gradient echo 303 and to desensitize it to velocity along the x axis, gradient pulses 308 and 309 are produced prior to the pulse 307. There are a number of well known strategies to accomplish this.

At least two complete data sets, each with difference flow sensitivity along one direction, are needed. In the preferred embodiment data for the sets is acquired in an interleaved fashion. In this approach, two or more measurements with different flow sensitivity are acquired with one value of the phase encoding gradient. The phase encoding value is then changed and additional measurements are made at this new phase encoding value with the two or more flow sensitivities. This process continues until all the phase encoding values have been employed. The acquired data is then reordered into k-space NMR data sets, each with a different flow sensitivity. While this interleaved approach is preferred, in the following discussion the invention is described as if the k-space NMR data sets are each completely acquired prior to the next flow encoding being used.

Figure 3B:
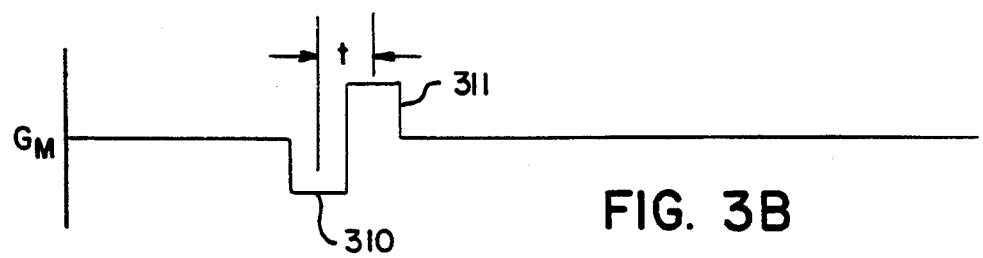

To produce NMR signals which are velocity sensitized, the pulse sequence shown in FIG. 3A is used, except the gradient $G_M$ has a value which sensitizes the acquired NMR signals to velocity along the direction of $G_M$. This is illustrated in FIG. 3B, where $G_M$ has a bipolar waveform comprised of a negative gradient pulse 310 followed by a positive gradient pulse 311. The area (A) defined by each pulse 310 and 311 is the same, and the centers of each gradient pulse 310 and 311 are spaced from one another by a time interval (t). The incremental first moment ($\Delta M_1$) provided by the $G_M$ gradient is, therefore $\Delta M_1 = A \times t$, and this gradient first moment $\Delta M_1$ is applied after the application of the RF excitation pulse 300 and before the acquisition of the signal 303. While the gradient $G_M$ is illustrated as a separate gradient magnetic field, in fact, it is produced by the same coils which produce the $G_x$, $G_y$ and $G_z$ gradient fields. By combining $G_x$, $G_y$ and $G_z$ gradient fields of the proper amplitude, the gradient moment $G_M$ can be oriented in any direction in space in order to sensitize for flow in that direction. For example, it is quite common to sensitize for flow in the slice selection direction, in which case the gradient moment $G_M$ is produced solely by the $G_z$ gradient coil. Thus, in the preferred embodiment a first array (bp+) of NMR data is acquired using the pulse sequence of FIG. 3A, but with the $G_M$ gradient field of FIG. 3B added. The acquired NMR data set (bp+) is Fourier transformed along both of its axes as described above, and stored in the computer system 107.

Figure 3C:
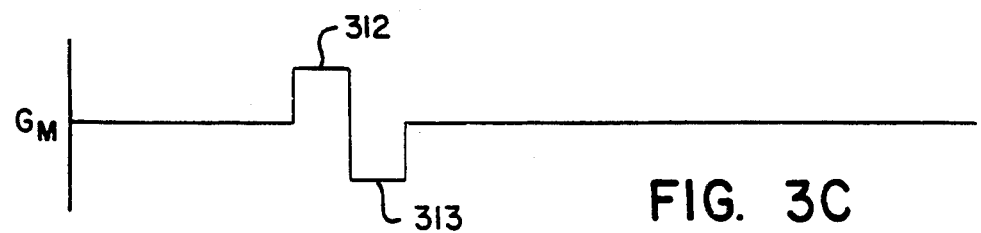

After the first array of NMR signals have been acquired, a second array (bp−) of NMR data is acquired. This is done during a scan in which the pulse sequence of FIG. 3A is employed, but the gradient moment $G_M$ is altered as shown in FIG. 3C to produce a moment of $-\Delta M_1$. This is accomplished with gradient pulse 312 and 313 which are identical, but opposite in direction to the gradient pulses 310 and 311. After the 256 NMR signals have been acquired the NMR data set (bp−) is Fourier transformed as described above and stored in the computer system 107.

It should be apparent to those skilled in the art that many variations in the data acquisition phase of the invention are possible. Other NMR pulse sequences can be employed, and as was mentioned previously, the acquisition of the k-space NMR data sets can be interleaved. Also, multiple sequences may be conducted at each phase encoding gradient $G_y$ in order to improve signal-to-noise or to cancel system errors. There are also many different ways to produce the gradient moment $\Delta M_1$ using the gradient $G_M$. For example, the gradient pulses 310–313 can be shaped differently, or they may be separated in time to increase the first moment $\Delta M_1$. Also, it is possible to employ spin echo sequences which use 180° RF pulses to refocus the undesirable effects of static magnetic field inhomogeneities. If 180° pulses are used, as is known to those skilled in the art, the first moment can be produced by gradient lobes of the same polarity placed on opposite sides of the 180° RF pulse. Also, as described by David M. Weber et al in "Quantitative velocity Images From Thick Slab 2D Phase Contrast", *Magnetic Resonance In Medicine*, 29:216–225 (1993), additional NMR data may be acquired with no velocity encoding gradient in order to improve the accuracy of the velocity information in the phase difference array.

The present invention is implemented under the direction of a program executed by the computer system 107. A source code listing of this program is provided in Appendix A and the process carried out by this program will be explained with reference to FIGS. 5A and 5B.

Referring to FIGS. 5A and 5B, a complex difference array CD is produced as indicated at process block 200 from the I and Q values of the two bipolar flow encoded arrays bp+ and bp−:

$$CD = \sqrt{(I_{bp+} - I_{bp-})^2 + (Q_{bp+} - Q_{bp-})^2}.$$

The values in this complex difference array CD are corrected as will be described below using information derived from a phase difference array PD, which is produced next as indicated at process block 201. The phase difference array PD may be calculated quite simply by calculating the phase of the elements in the two bipolar flow encoded arrays bp+ and bp−

$$\theta_{bp+} = \tan^{-1}(Q_{bp+}/I_{bp+})$$

$$\theta_{bp-} = \tan^{-1}(Q_{bp-}/I_{bp-})$$

and subtracting corresponding phases $$\phi_{PD} = \theta_{bp+} - \theta_{bp-}.$$

In the preferred embodiment, however, the more complex method described in the above referenced article is employed because it provides a more accurate indication of spin velocity in voxels that are partially filled with stationary spins.

A velocity array (V) is produced from the phase difference array PD as indicated at process block 202. This is achieved by dividing each phase element $\phi_{PD}$ therein as follows:

$$V_{PD} = \phi_{PD}\gamma\Delta M,$$

where $\gamma$ is the gyromagnetic constant of the spins and $\Delta M$ is the change in flow encoding gradient first moment between the two data sets bp+ and bp−.

From the velocity array (V) the elements of a saturation correction array ($\alpha$) are calculated as indicated at process block 203. This saturation correction array ($\alpha$) is a picture of the available longitudinal magnetization at each voxel in the imaged slice. Where the velocity indicated by velocity array (V) is relatively high and spins flowing through the imaged slice see only one rf excitation pulse, longitudinal magnetization is maximum and $\alpha$ is set to "1". On the other hand, near vessel walls where velocity is lower, the spins see multiple rf excitations as they flow through the imaged slice, and the available longitudinal magnetization is reduced. The exact reduction in value of $\alpha$ as a function of velocity V depends on such factors as slice thickness, pulse repetition rate (TR) and tip angle of the rf excitation pulse. For each voxel in the velocity array (V) a corresponding value ($\alpha$) is calculated by determining the number of rf excitation pulses the spins will "see" as they flow through the slice and by reducing the value $\alpha$ from 1.0 to indicate the proportionate reduction in longitudinal magnetization of those spins. It has been found that this saturation correction provides good results down to a velocity of approximately 20% of the maximum velocity seen at the center of a blood vessel. Below this 20% level the correction is inaccurate due to noise in the phase difference data, and for that reason, values for $\alpha$ are not dropped below that calculated for 20% of maximum velocity. The complex difference array (CD) is then corrected for saturation effects as indicated at process block 204 by dividing each element therein by the corresponding correction value in the saturation correction array ($\alpha$). A corrected complex difference array $CD_1$ results.

Referring still to FIGS. 5A and 5B, the next step in the process is to produce a calibration array (CAL) as indicated at process block 205. This is accomplished by dividing each phase value in the phase difference array (PD) by two, and calculating the sine of that angle:

$$CAL = \sin(\phi_{PD}/2).$$

A calibration value A is then calculated by finding one or more voxels at the center of the blood vessel where all spins are flowing (i.e. filling factor=1) and finding the ratio of complex difference array ($CD_1$) values for those voxels over the corresponding values in the calibration array (CAL). The calibration value A is the mean value of these ratios:

$$A = CD_1/CAL(\text{mean}).$$

The complex difference array ($CD_1$) is then calibrated at process block 206 by dividing the elements therein by the calibration value A and taking the inverse sine:

$$CD_2 = \sin^{-1}(CD_1/A).$$

The resulting complex difference array $CD_2$ indicates the absolute value of the spin flow at each voxel, but it does not contain flow direction information.

To recover the flow direction information a mask (SIGN) is produced from the phase difference array (PD) as indicated at process block 207. The mask (SIGN) is a two-dimensional array with a bit therein corresponding to each voxel in the imaged slice. Each bit which corresponds to a positive phase difference ($\phi_{PD} > 0$) in the phase difference array is set to a "1", and each bit in the sign mask corresponding to a negative phase difference ($\phi_{PD} < 0$) is set to a "−1". As indicated at process block 208, this sign mask is applied to the complex difference array ($CD_2$) by multiplying each element therein by the corresponding value in the complex difference array ($CD_2$) to produce the final complex difference array ($CD_3$).

Referring still to FIGS. 5A and 5B, the final flow image is produced as indicated at process block 209 by multiplying each complex difference element $CD_3$ as follows:

$$\text{flow} = pv = 2CD_3/\gamma\Delta M_1.$$

The total flow through any vessel in the resulting flow image is obtained by summing up the flow values (pv) for each voxel in the vessel. In the preferred embodiment the flow image is displayed and the operator draws a boundary around the desired blood vessel using a track ball on the operator controls 103. The flow values (pv) located within this boundary are summed and the result displayed as a total flow value.

We claim:

1. In an NMR system for acquiring NMR data from a subject and reconstructing an image from the data, the method comprising:
   a) acquiring two NMR data sets from which two separate images are reconstructed, the two NMR data sets being acquired with different velocity encoding magnetic field gradients applied to the subject;
   b) producing a phase difference array by calculating the phase of each value in the two NMR data sets and calculating the difference between the phases of corresponding values in each of the two NMR data sets;
   c) producing a complex difference array by calculating the square root of the sum of the squares of the differences between corresponding real values in the two NMR data sets and the differences between corresponding quadrature values in the two NMR data sets;
   d) correcting the complex difference array for saturation effects using velocity information derived from the phase difference array; and
   e) producing a flow image from the corrected complex difference array.

2. The method as recited in claim 1 in which step d) also includes:
   producing a calibration factor from information derived from locations in the phase difference array and information derived from corresponding locations in the complex difference array, and calibrating the entire complex difference array with the calibration factor.

3. The method as recited in claim 1 which also includes:
   f) producing a sign mask from the phase difference array which indicates the direction of flow at each location therein, and applying the sign mask to add flow direction information to the flow image.

4. The method as recited in claim 1 in which step d) includes:
   producing a velocity array from the phase difference array by dividing the values in the phase difference array with a constant value;
   producing a saturation correction array using values in the velocity array to determine the longitudinal magnetization available at corresponding array locations; and
   correcting the values in the complex difference array with corresponding values in the saturation correction array.

5. The method as recited in claim 2 in which the calibration factor is produced by:
   producing a calibration array by taking the sine of one half the corresponding value in the phase difference array;
   calculating the calibration factor as the mean value of the ratio of selected values in the complex difference array over the corresponding values in the calibration array.

* * * * *